United States Patent
Yamazaki et al.

[11] Patent Number: 5,955,765
[45] Date of Patent: Sep. 21, 1999

[54] THIN-FILM DUAL GATE, COMMON CHANNEL SEMICONDUCTOR DEVICE HAVING A SINGLE FIRST GATE AND A MULTI-GATE SECOND GATE STRUCTURE

[75] Inventors: Shunpei Yamazaki, Tokyo; Jun Koyama; Yasuhiko Takemura, both of Kanagawa, all of Japan

[73] Assignee: Semiconductor Energy Laboratory Co., Ltd., Kanagawa-ken, Japan

[21] Appl. No.: 08/818,166

[22] Filed: Mar. 14, 1997

[30] Foreign Application Priority Data

Mar. 15, 1996 [JP] Japan .................................... 8-087531

[51] Int. Cl.$^6$ ................................................. H01L 21/265
[52] U.S. Cl. .......................... 257/365; 257/57; 257/347; 257/366; 257/59; 438/149; 438/157; 438/158; 438/176; 438/195
[58] Field of Search ..................................... 257/347, 348, 257/365, 366, 192–194, 616, 59; 438/149, 157, 158, 176, 195

[56] References Cited

U.S. PATENT DOCUMENTS

5,446,299  8/1995  Acovic et al. ........................... 257/315
5,580,802  12/1996  Mayer et al. ........................... 438/157

*Primary Examiner*—Fetsum Abraham
*Attorney, Agent, or Firm*—Fish & Richardson P.C.

[57] ABSTRACT

An insulated-gate thin-film semiconductor device having reduced leakage current. The device has a thin-film semiconductor in which source and drain regions are formed. First and second electrodes are formed on opposite sides of the thin-film semiconductor. At least one of the second electrodes electrically overlaps none of the source and drain regions. When a reverse bias voltage is applied to the first gate electrode (i.e., in an unselected state), a forward bias voltage is applied to the second gate electrode, thus controlling the leakage current path. Thus, the resistance in the unselected state is increased. Consequently, the leakage current is reduced. Because of this construction, the on/off current ratio of the thin-film transistor can be enhanced.

18 Claims, 5 Drawing Sheets

Fig.6(A) OFF-state (Band Diagram)

Fig.6(B) ON-state (Band Diagram)

Fig.6(C) Typical $I_D$-$V_G$ curve

THIN-FILM DUAL GATE, COMMON CHANNEL SEMICONDUCTOR DEVICE HAVING A SINGLE FIRST GATE AND A MULTI-GATE SECOND GATE STRUCTURE

BACKGROUND OF THE INVENTION

1. Field of the Invention

The present invention relates to structures of thin-film integrated circuits formed on insulating surfaces and circuit elements used for them, e.g., structures of thin-film transistors (TFTs). Insulating surfaces referred to herein encompass dielectric layers formed on surfaces of semiconductors or metals, as well as surfaces of insulators. That is, integrated circuits and TFTs manufactured according to the present invention include not only those which are formed on insulating substrates consisting, for example, of glass but also those which are formed on an insulator deposited on a semiconductor substrate consisting of a single-crystal silicon or the like.

2. Description of the Related Art

Thin-film semiconductor devices such as TFTs are obtained by forming islands of a substantially intrinsic semiconductor region (active layer) on an insulating surface, then forming a dielectric film as a gate insulator film by CVD or sputtering, and forming gate electrodes on the dielectric film. In another method, the gate electrodes are formed beforehand, and then a gate insulator film and an active layer are deposited over the gate electrodes. In the former case, source/drain regions are formed by diffusing N- or P-type dopants into an intrinsic thin-film semiconductor. The latter method may also utilize dopant diffusion but it is common practice to form a separate N- or P-type semiconductor film.

The prior art TFT has N- or P-type source/drain regions, a substantially intrinsic channel region, a gate insulator film, and a gate electrode. The gate insulator film and gate electrode are deposited on the channel region. Conductive interconnects and electrodes (referred to as source electrode/interconnects and as drain electrode/interconnects) are connected with the source and drain regions, respectively, to permit electrical connections with the outside. The TFT is controlled by three terminals comprising these source and drain electrodes plus the gate electrode.

In some circuits, it is impossible to clearly distinguish between source and drain regions. In the following description, therefore, the source and drain regions are not discerned by the circuit but rather can be set arbitrarily. That is, an n- or p-type region connected with a terminal which is not a region arbitrarily defined as a source region is defined as a drain region. In recent years, it has been attempted to fabricate an active layer from a crystalline semiconductor instead of an amorphous semiconductor because there is a need to increase the field mobility of the TFT.

The greatest problem with TFTs using such non-single crystal semiconductors, especially non-single-crystal semiconductors (e.g., polysilicon) having crystallinity, is that the leakage current (off current) is large. In particular, when no voltage is applied to the gate electrode, or when a reverse voltage is applied (i.e., in an unselected or off state), no channel (current path) is created. Therefore, no electric current should flow. In practice, however, currents more than normally observed leakage current flowing through a single-crystal semiconductor are observed. Accordingly, it is considered that this phenomenon is inherent to the non-single-crystal semiconductor.

Such large leakage current poses problems in applications where dynamic operation (such as charge retention) is required. Furthermore, in applications where static operation is necessitated, the electric power consumption is undesirably increased.

It is expected that TFTs will find extensive application in active matrix circuits typified by liquid crystal displays. In this kind of circuit, the TFTs act as switching transistors for the pixels arranged in rows and columns. For this purpose, it is required that electric charge stored in pixel electrodes and their auxiliary capacitors (retaining capacitors) do not leak. If large leakage current occurs, electric charge cannot be retained for a sufficiently long time.

It has been considered that the leakage current can be reduced effectively by increasing the channel length or reducing the channel width. If this approach is adopted, the absolute value of the leakage current decreases. However, when a voltage is applied to the gate electrode, i.e., in a selected (on) state, the drain current (on current) is also reduced. As a result, the required operation may not be carried out. That is, with this method, the ratio of the drain current to the leakage current (on/off current ratio) cannot be improved.

SUMMARY OF THE INVENTION

In view of these problems, the present invention has been made. It is an object of the present invention to provide a TFT having an active layer comprising a semiconductor different from a single crystal, the TFT being characterized in that the leakage current is reduced and that the on/off current ratio is improved.

The present invention pertains to a thin-film semiconductor device having a thin-film semiconductor, a gate insulator film, and a gate electrode. In the present invention, a second gate electrode and a second gate insulator film are formed in addition to the prior art TFT. That is, the second gate electrode added according to the invention is fabricated, in addition to the first gate electrode equivalent to the prior art gate electrode. The gate insulator films corresponding to the gate electrodes, respectively, are also formed. In a thin-film semiconductor device providing a basis for the present invention, the aforementioned thin-film semiconductor is built up in the form of islands. Source/drain regions are formed at the same or different levels.

In one feature of the invention, the second gate electrode is so formed as to overlap none of the source/drain regions. When a reverse bias voltage is applied to the first gate electrode, a forward bias voltage is impressed on the second gate electrode.

One aspect of the present invention lies in a thin-film semiconductor device which satisfies the above-described conditions and in which first and second gate electrodes are located on opposite sides of a thin-film semiconductor.

Another feature of the invention is based on the fact that we have noted that a thin-film semiconductor has two principal faces. The first gate electrode is formed on the first principal face of the thin film semiconductor with the first gate insulator therebetween. The second gate electrodes are located on the second principal face with the second gate insulator film therebetween.

In the present invention, the process sequence is simplified by forming the second gate electrodes from the same film as conductive interconnects connected with at least one of the source and drain regions.

The present invention can be applied to a so-called top-gate TFT in which the thin-film semiconductor is located between the substrate and each first gate electrode. Similarly, the invention is applicable to a so-called bottom-gate TFT where each first gate electrode is positioned between the substrate and the thin-film semiconductor.

Figure 1A:
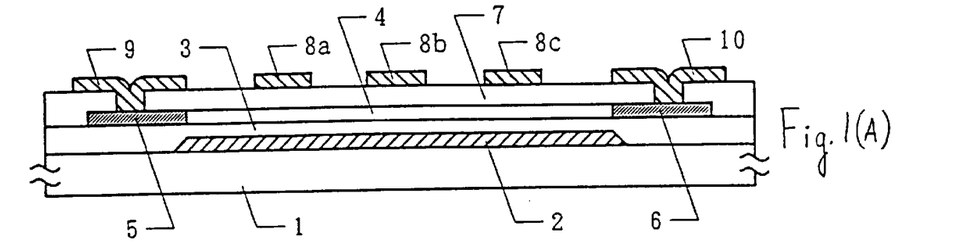
FIGS. 1(A)–1(D) illustrate a fundamental structure of a semiconductor device according to the invention.

The fundamental structure of the present invention is shown in FIGS. 1(A)–1(D), which depict an example of the bottom-gate type. FIG. 1(A) is a cross section of the structure. A first gate electrode 2, a first gate insulator film 3, and a thin-film semiconductor 4 are formed on a substrate 1. A source region 5 and a drain region 6 are formed at opposite ends of the thin-film semiconductor. A second gate insulator film 7 and second gate electrodes 8a–8c are formed over the substrate. If necessary, source electrode/interconnect 9 and drain electrode/interconnect 10 may be formed (FIG. 1(A)).

Figure 1B:
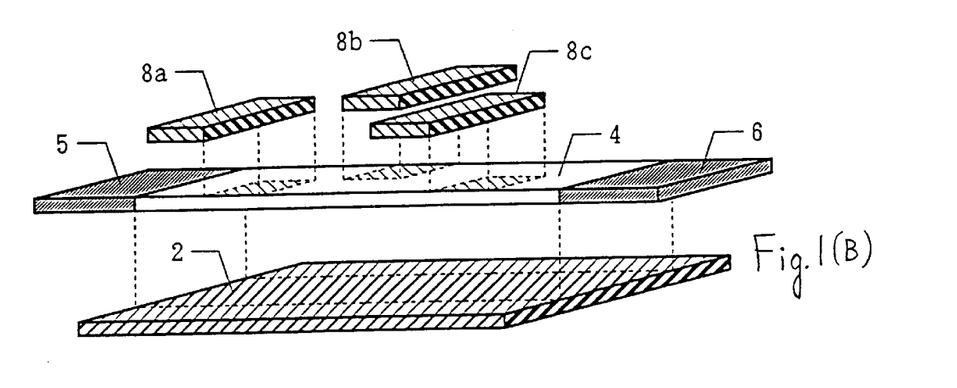

In FIG. 1(A), the arrangement of the second gate electrodes is not clear and so its lamination structure is shown in FIG. 1(B) (FIG. 1(B)).

Figure 1C:
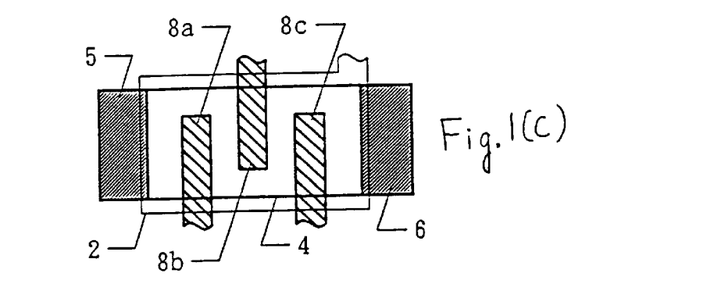

The manner in which it is viewed from above is shown in FIG. 1(C). In the present invention it is required that at least one of the second gate electrodes electrically overlap none of the source and drain regions. Meant by "electrically" is the electrical effect of the second electrodes. Even where the at least one second gate electrode geometrically overlaps the source and drain regions, if the second gate electrode exerts no electrical effect on the geometrically overlapping portion, then the second gate electrode is referred to as not "electrically" overlapping (FIG. 1(C)).

Figure 1D:
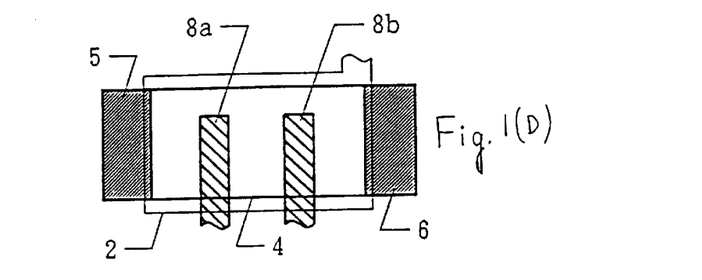

In the present invention, the second gate electrodes are formed in a staggered relation (alternative relation) to each other as shown in FIG. 1(C). Also, second gate electrodes 8a and 8b may also be formed in a parallel relation to each other as shown in FIG. 1(D) (FIG. 1(D)).

In the present invention, if a portion not overlapping any second gate electrode on or in a thin-film semiconductor is defined as a base region (i.e., the second gate electrodes exert no electrical effect on this base region), and if the second gate electrodes are arranged so as to satisfy the following conditions, then the effects of the present invention are enhanced further:

That is, a third aspect of the invention is that the shortest distance from the source region to the drain region only via the base region is greater than the shortest distance from the source region to the drain region via the thin-film semiconductor.

A fourth aspect of the invention is that the average width of the base region (i.e., the area of the base region divided by the shortest path distance from the source region to the drain region only via the base region) is smaller than the width of the thin-film semiconductor (i.e., the area of the thin-film semiconductor excluding the source and drain regions divided by the shortest path length from the source region to the drain region).

It is to be noted that the base region is so defined that emphasis is placed on the electrical effect of the second gate electrodes rather than the geometry of the second electrodes themselves.

Furthermore, in the present invention, with respect to selected and unselected states as described below, it suffices to electrically control only the base region. Therefore, the first gate electrodes are not required to exist outside the base region where the second gate electrodes overlap the thin-film semiconductor. Accordingly, the following condition may be added to the third and fourth aspects of the invention.

The base region is substantially identical in geometry with the first gate electrodes.

In order that the base region and the first gate electrodes be similar in geometry in this way, the second gate electrodes are patterned by a self-aligned photolithographic technique using the first gate electrodes as a mask. This condition may be added to the third through sixth aspects of the invention.

Figures 6A, 6B, 6C:
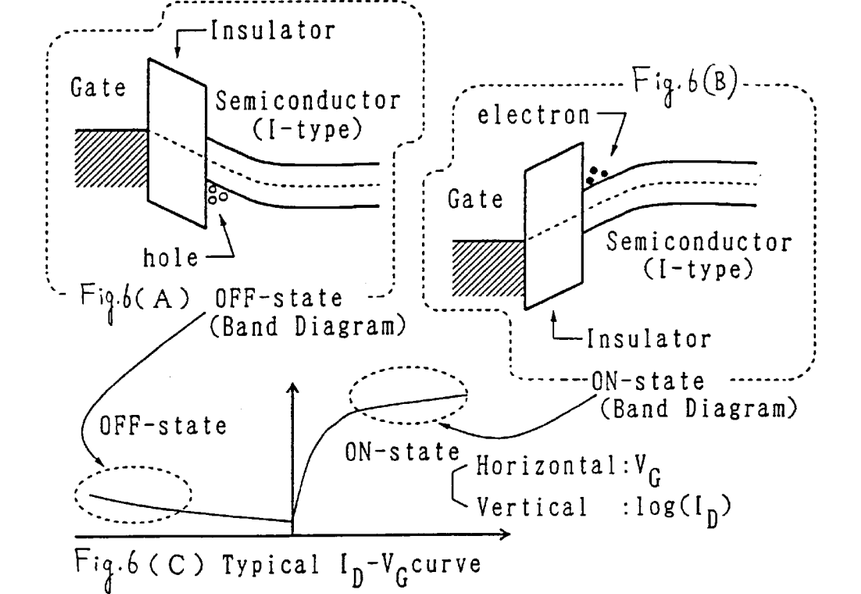
FIG. 6 illustrates the fundamental operating principle of a semiconductor device according to the invention.

The selected (on) state of the present invention does not differ at all from that of the prior art TFT. The invention is characterized by its unselected (off) state. In the semiconductor device shown in FIGS. 1(A)–1(D), it is assumed that the second gate electrodes are at the same potential as the source region. A relatively large reverse bias voltage is applied to the first gate electrodes. For the N-channel semiconductor device, when it is in a selected state (i.e., a forward (positive) bias voltage is applied to the first gate electrodes), majority carriers (i.e., electrons) are attracted to the thin-film semiconductor that faces the first gate electrodes, as shown in FIG. 6(B). These carriers take on conduction between the source and drain (FIG. 6(B)).

On the other hand, in an unselected state (i.e., a reverse (negative) bias voltage is applied to the first gate electrodes), minority carriers (i.e., positive holes) are attracted to the thin-film semiconductor facing the first gate electrodes, as shown in FIG. 6(A). These carriers then contribute to the conduction (FIG. 6(A)).

Figure 2A:
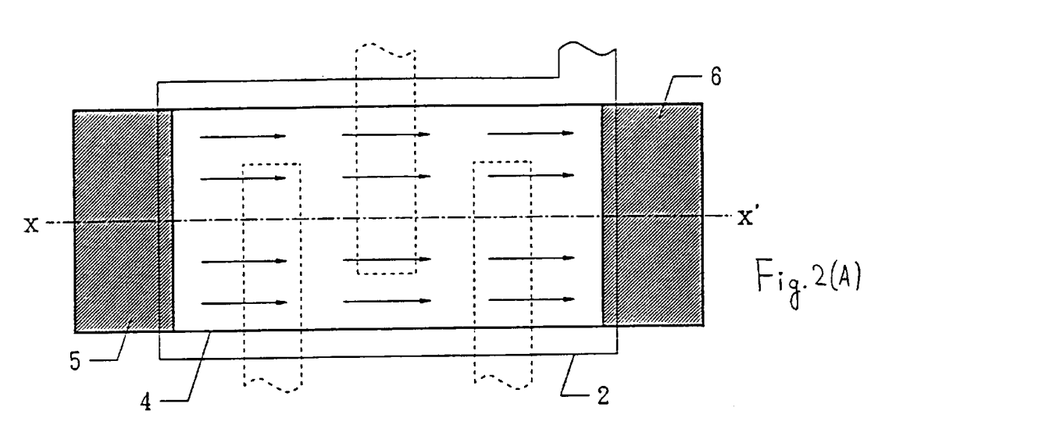
FIGS. 2(A) and 2(B) illustrate the fundamental operating principle of the semiconductor device according to the invention.
Figure 4A:
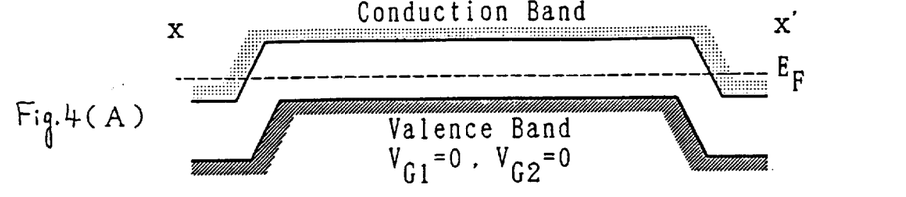
FIGS. 4(A)–4(C) illustrate the fundamental operating principle of a semiconductor device according to the invention.
Figure 4B:
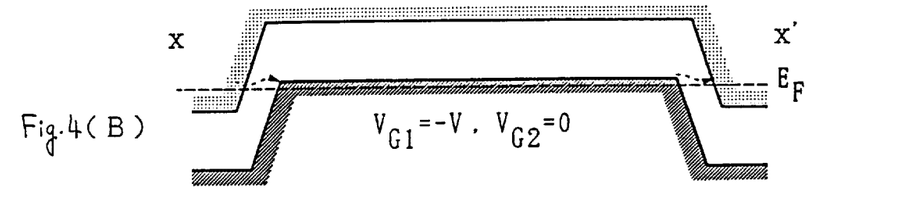

Energy bands of the thin-film semiconductor along x—x' of FIG. 2(A) are shown in FIGS. 4(A) and 4(B). $E_F$ means the Fermi level. FIG. 4(A) shows a state in which the voltage across the first gate electrode is set equal to the voltage across the source region ($V_{G1}=0$). FIG. 4(B) shows a state in which a negative voltage (–V) of some magnitude is applied to the first gate electrode ($V_{G1}=-V$). $V_{G2}$ indicates the magnitude of the voltage applied to the second gate electrode (FIGS. 4(A) and 4(B)).

A gap exists between the source region and the thin-film semiconductor. Also, a gap exists between the drain region and the thin-film semiconductor. Positive holes which are minority carries cannot move across these gaps. Therefore, ideally, no conduction occurs between the source and drain.

However, it is known in the art of non-single-crystal semiconductors that conduction occurs by hopping between local levels created by crystal defects and so on. Positive holes induced on the surface of a thin-film semiconductor recombine, by this mechanism, with electrons moving out of the source and drain regions. As a result, conduction (leakage current) takes place between the source and drain. The dotted arrows in FIGS. 4(A)–4(C) indicate hopping conduction. Of course, a considerable magnitude of resistance is produced although the mechanism is relies on hopping. If the reverse bias voltage applied to the first gate electrode is increased, more minority carriers (positive holes) are induced. This enhances the conductivity, leading to an increase in leakage current.

FIG. 2(A) depicts the flow of leakage current when the prior art TFT is in an unselected state. It is observed that the current flows across the whole cross section of the thin-film semiconductor (FIG. 2(A)).

We now discuss a state obtained by applying a positive voltage of some magnitude (+V) to the second gate electrode ($V_{G2}=+V$). Majority carriers (electrons) are induced on the surface of the thin-film semiconductor which faces the second gate electrode. The energy band diagram takes a complex form as shown in FIG. 4(C) (FIG. 4(C)).

Figure 4C:
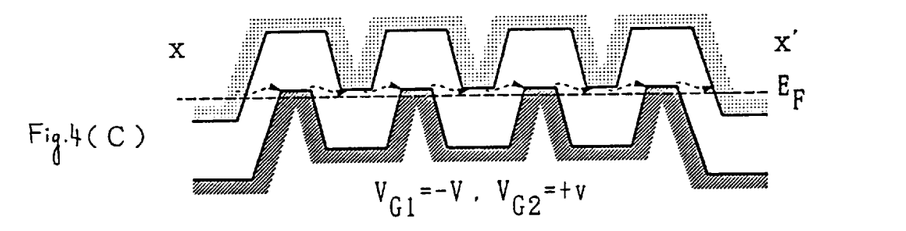

FIG. 5 is an electrical circuit representation of the thin-film semiconductor, based on the energy band diagrams of FIGS. 4(B) and 4(C). In FIG. 5(A), there is shown a series combination of the resistance $R_1$ of the junction of the source region and the thin-film semiconductor, the resistance $R_2$ of the junction of the drain region and the thin-film semiconductor, and the resistance $R_3$ of the thin-film semiconductor itself. $R_3$ is determined by the reverse bias voltage applied to the first gate. As the reverse bias voltage is increased, more minority carriers are induced, reducing $R_3$. Eventually, $R_3$ becomes so small that it can be neglected compared with $R_1$ and $R_2$. Practically, the leakage current is determined by $R_1$ and $R_2$ (FIG. 5(A)).

Figure 5A:
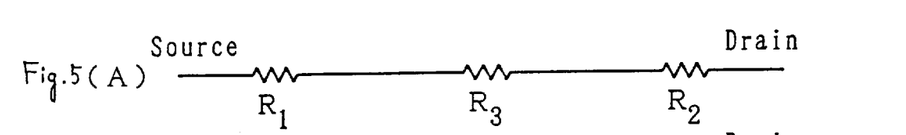
FIGS. 5(A)–5(D) illustrate the fundamental operating principle of a semiconductor device according to the invention.
Figure 5B:
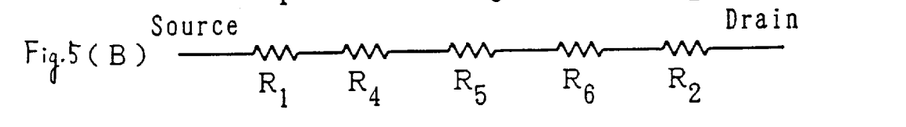

However, if a forward bias voltage is applied to the second gate electrode, then the junction is increased. This increases the resistance inserted in series accordingly. That is, a resistance is produced by two junctions per second gate electrode. In FIG. 5(B), these two resistances are represented by means of one resistance. Resistances are indicated by $R_4$–$R_6$. In particular, there exist three second gate electrodes and so three resistances are produced. Also, the thin-film semiconductor has a resistance intrinsic in it but this is not shown (FIG. 5(B)).

Figure 2B:
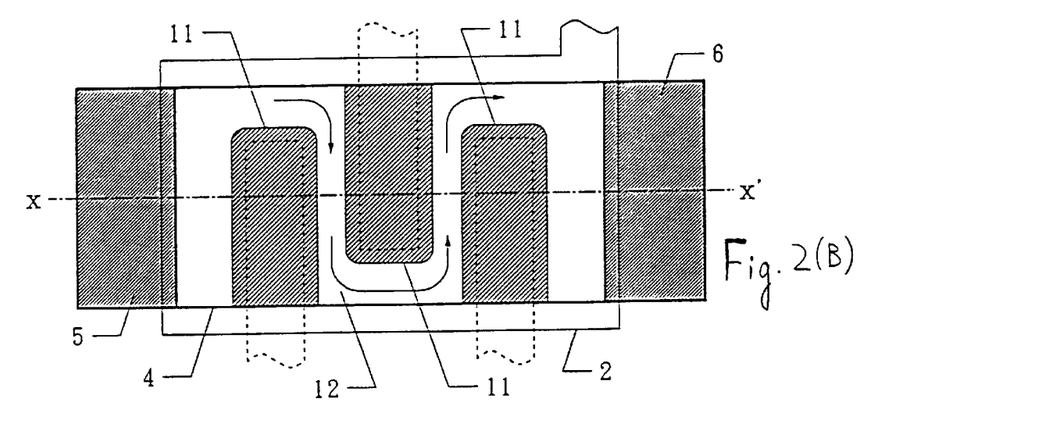
Figure 5C:
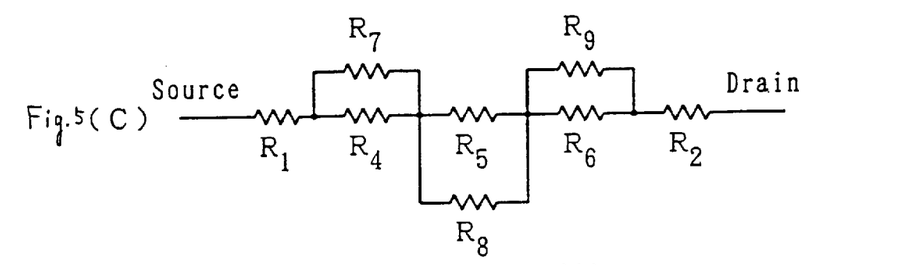

FIG. 2(B) shows the manner in which this state is viewed from above. An inversion layer 11 is created in portions where the second gate electrodes exist; the remaining portion becomes a base region 12. A leakage current path extends along line x—x'. Another path runs along the base region as indicated by the arrow in the figure. Letting $R_7$–$R_9$ be the resistances of currents along the base region, a circuit as shown in FIG. 5(C) is obtained.

Figure 5D:
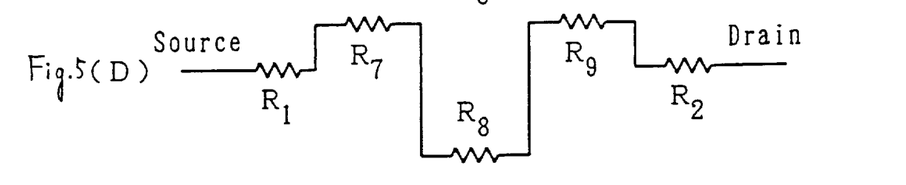

In practice, however, the $R_4$–$R_6$ is much larger than the $R_7$–$R_9$ and, therefore, the leakage current flows principally through the $R_7$–$R_9$ (i.e., base region). Practically, the circuit is represented by the circuit diagram of FIG. 5(D) (FIG. 5(D)).

The problem is the comparison between the magnitudes of $R_3$ and ($R_7$+$R_8$+$R_9$). As can be seen from comparison between FIGS. 2(A) and 2(B), $R_3$ (thin-film semiconductor 4) is wider and shorter than ($R_7$+$R_8$+$R_9$) (base region 12). Obviously, the resistance of the former is smaller than that of the latter. This is the same as the third and fourth aspects of the present invention. That is, the resistance in an unselected state can be increased and the leakage current can be reduced by appropriately arranging the second gate electrodes and applying a forward bias voltage to them.

The same principle applies to a thin-film semiconductor device having a structure as shown in FIG. 1(D). As can be seen from this figure, the average width of the base region is smaller than the width of the thin-film semiconductor itself.

In this way, in the present invention, the leakage current in an unselected state is reduced but the drain current in a selected state is left intact. As a result, the on/off current ratio can be increased. This is equivalent to the feature of the invention that the current paths for drain current and leakage current differ between selected and unselected states.

In order to further increase the length of the base region in an unselected state, the number of the second gate electrodes should be set to 2 or more, preferably 3 or more. Similarly, in order to reduce the width of the base region to a minimum, the spacing between the second gate electrodes should be minimized.

Furthermore, if a thin-film semiconductor having a large width (channel width in a selected state) and a small length (distance between the source and drain) is used, the on/off current ratio can be increased further. Consequently, the effective channel length in an unselected state can be made 5 to 50 times as large as the channel length in a selected state. The effective channel width in an unselected state can be made smaller than the channel width in a selected state by a factor of 2 to 20. As a result, the on/off current ratio can be increased 100 times as compared with the conventional case.

DETAILED DESCRIPTION OF THE PREFERRED EMBODIMENTS

EMBODIMENT 1

Figure 3:
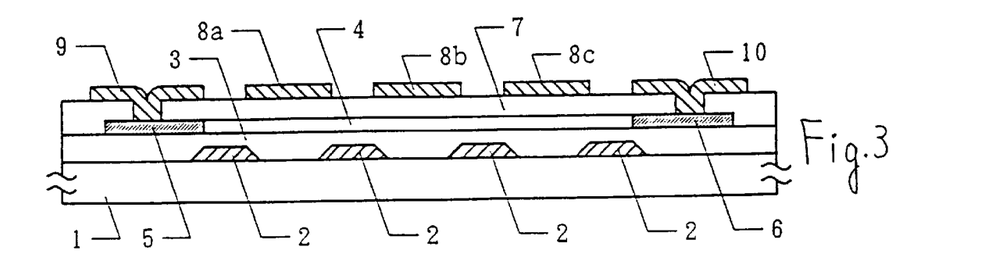
FIG. 3 is a cross-sectional view of a semiconductor device of Embodiment 1.

FIG. 3 is a cross-sectional view of a semiconductor device of the present embodiment. FIG. 7 is a top view of this device. In the present embodiment, a first gate electrode 2 is made substantially identical in geometry with a base region which is the part of a thin-film semiconductor not overlapping the second gate electrode. That is, the overlap between the first and second gate electrodes is reduced to a minimum. In these figures, the same reference numerals are used as in FIGS. 1(A)–1(D) (FIG. 3).

In the present embodiment, the overlap between the geometries of the first and second gate themselves is reduced. The concept of the present embodiment similarly applies to a case in which these two kinds of gates overlap to a large extent geometrically but to a small extent electrically.

Figure 7A:
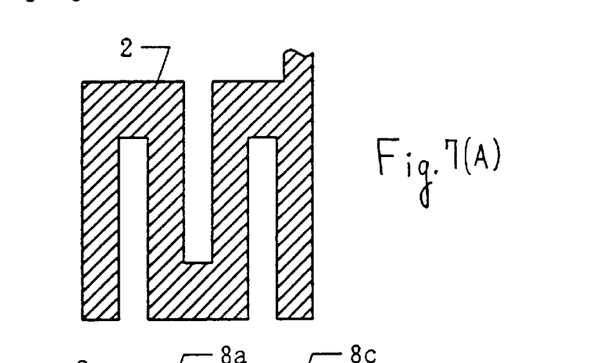
FIGS. 7(A) and 7(B) are top views of semiconductor devices of Embodiment 1.
Figure 7B:
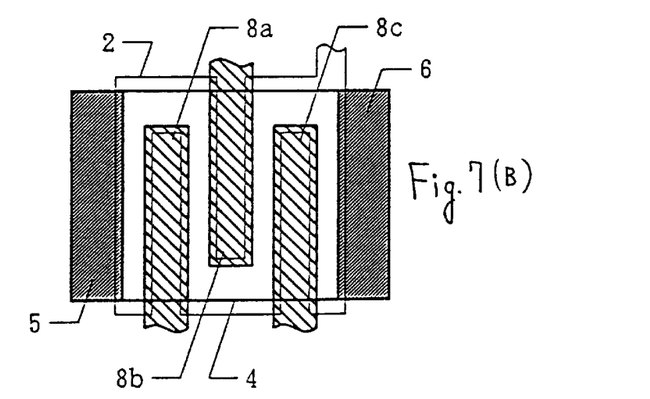

The first gate electrode 2 seems plural in number in FIG. 3 but is unitary as shown in FIG. 7(A). In FIG. 7(B), a thin-film semiconductor 4, a source region 5, a drain region 6, and second gate electrodes 8a–8c are stacked on the first gate electrode 2 (FIG. 7).

The semiconductor device of this construction operates similarly to the semiconductor device shown in FIGS. 1(A)–1(D) in an unselected state. In particular, since it is in an unselected state, a reverse bias voltage is applied to the first gate electrode 2. A forward bias voltage is applied to the second gate electrodes 8a–8c. Minority carriers bypass the base region in the same way as in the process already described in connection with FIGS. 2(A) and 2(B).

However, if the same voltage is applied to the second gate electrodes 8a–8c as the voltage to the source region, the same effects are produced. In this case, the resistances $R_4$–$R_6$ (FIGS. 5(A)–5(D)) produced by band gaps are small.

However, little carriers are induced by the second gate electrodes 8a–8c. Therefore, the resistances of these portions are quite high. Accordingly, if the same voltage is applied to the second gate electrodes 8a–8c as the voltage to the source region, almost all the leakage current flows through the base region. That is, in the semiconductor device of the present embodiment, in an unselected state, the voltage impressed on the second gate electrodes 8a–8c is other than the reverse bias voltage. This voltage is so set that the second gate electrodes 8a–8c induce no minority carriers.

On the other hand, in a selected state, if a forward bias voltage is applied to the second gate electrodes 8a–8c of the semiconductor device shown in FIGS. 1(A)–1(D), or if the same voltage is applied to the second gate electrodes 8a–8c as the voltage to the source region 5, the flow of the drain current does not change greatly. However, the semiconductor device of the present embodiment is required that a forward bias voltage be applied to the second gate electrodes 8a–8c ; otherwise the drain current would flow mainly through the base region in the same way as in an unselected state. This would make it impossible to achieve the object of the present invention, i.e., the on/off current ratio is improved by changing the current path between selected and unselected states.

The foregoing discussion had led to the conclusion that the easiest method of driving the semiconductor device of the present embodiment is to apply a forward bias voltage to the second gate electrodes 8a–8c continuously, whether the device is in a selected state or in an unselected state.

However, a method of varying the voltage applied to the second gate electrodes 8a–8c in step with the first gate electrode 2 is also advantageous. For example, in a selected state, a voltage 0.5–2 times as large as the voltage applied to the first gate electrode 2 is applied to the second gate electrodes 8a–8c , while in an unselected state, the same voltage is applied to them as the voltage to the source region 5. This method produces fruitful results.

EMBODIMENT 2

FIGS. 8(A)–8(F) illustrate a process sequence for fabricating a semiconductor device of the present embodiment. In the semiconductor device of the present embodiment, the first gate electrode and base region are made similar in geometry, in the same way as in Embodiment 1. For this purpose, the present embodiment uses a self-aligned patterning method. This method is hereinafter described briefly. Detailed conditions, materials, sizes, and other factors are well known in the art and may be employed intact.

First, a first gate electrode 102 is formed out of an opaque material such as tantalum, aluminum, molybdenum, tungsten, or chromium on a transparent substrate 101 made of glass, for example. The "transparent" substrate means that it transmits light used for photolithography in a later self-aligned patterning step. The geometry of the first gate electrode 102 is similar to the geometry shown in FIG. 7(A).

Figure 8A:
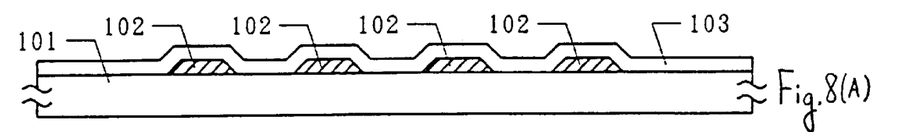
FIGS. 8(A)–8(F) are cross-sectional views illustrating the process sequence for a semiconductor device of Embodiment 2.

Then, a first gate insulator film 103 is deposited (FIG. 8(A)).

Figure 8B:
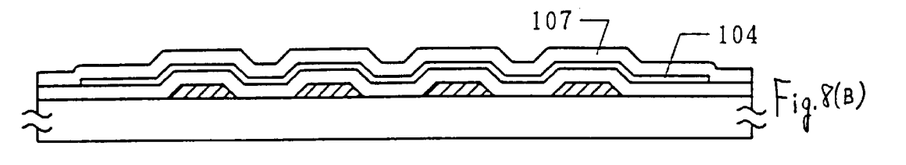

Subsequently, a thin-film semiconductor 104 and a second gate insulator film 107 are formed (FIG. 8(B)).

Figure 8C:
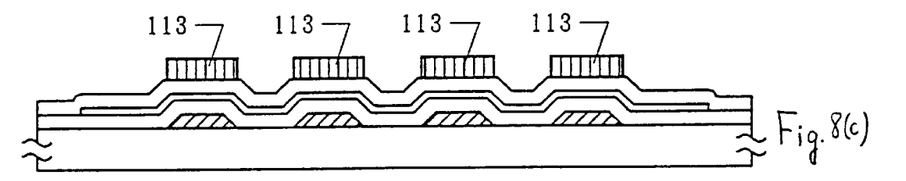
Figure 8D:
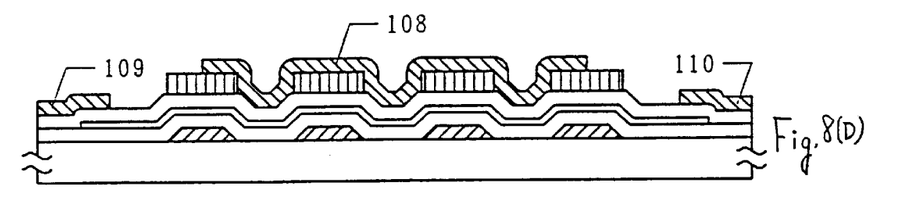
Figure 8E:
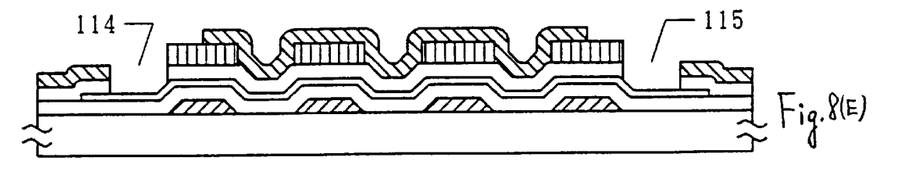
Figure 8F:
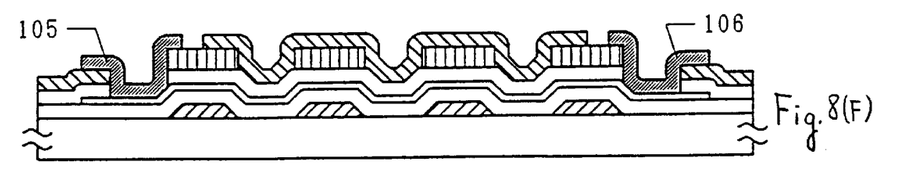

Thereafter, an insulator film is formed. Preferably, this insulator film is made as thick as possible and has a small dielectric constant. Because of this structure, even if a conductor overlies this film, the electrical effect on the underlying thin-film semiconductor is rendered infinitesimal. However, if the insulator layer is too thick, the unevenness of the device is increased, thus increasing the danger of breakage of conductor lines. Also, the dielectric constant is restricted by the material. Preferably, the material of this insulator layer differs from the second gate insulator 107 and is not etched during a later etching step for etching the second gate insulator 107. Hence, this material can be used as a mask.

For example, using silicon nitride as the second gate insulator 107 and silicon oxide as the present insulator layer is preferable to the dielectric constant and also to the etching characteristics.

Then, light is irradiated from the rear side, using a well-known back-side exposure technique as disclosed in Japanese Unexamined Patent No. 275452/1993. At this time, a photoresist whose irradiated portions are peeled off is used. Thus, the photoresist overlying the gate electrode 102 is shielded from the light. This portion of the photoresist is left behind; the remaining portion is peeled off. Using the resulting photoresist pattern, the insulator layer is etched, thus obtaining an insulator pattern 113. As can be seen from the discussion made thus far, the insulator pattern 113 is formed only over the first gate electrode 102 and so has the same geometrical pattern as the first gate electrode 102 (FIG. 8(C)).

Thereafter, a film of an appropriate material such as aluminum or tantalum is deposited by a well-known metallization method. This film is then patterned and etched by well-known photolithography and etching methods to form second gate electrode 108, source electrode/interconnects 109, and drain electrode/interconnects 110. At this time, the second gate electrode 108 is so patterned as to almost fully cover the thin-film semiconductor 104 (FIG. 8(D)).

Then, the second gate insulator film 107 is etched. If the conditions are so set that all of the second gate electrode 108, source electrode/interconnects 109, drain electrode/interconnects 110, and the insulator pattern 113 remain unetched, then only those portions which are not masked with any of them are etched. The result is that window holes 114 and 115 for source and drain regions, respectively, are created. If such etching conditions are not available, back-side exposure may be carried out again. During this exposure step, the second gate electrode 108, source electrode/interconnects 109, and drain electrode/interconnects 110 act as a mask, as well as the first gate electrode 102. In consequence, a pattern conforming to the window holes 114 and 115 can be obtained (FIG. 8(E)).

Subsequently, an N- or P-type doped thin-film semiconductor is formed by a well-known thin-film semiconductor fabrication technology. This film is then etched to form a source region 105 and a drain region 106, which are connected with the thin-film semiconductor 104 through the window holes 114 and 115, respectively. At the same time, the source and drain regions are connected with source electrode/interconnects 109 and drain electrode/interconnects 110, respectively (FIG. 8(F)).

In the present embodiment, four mask alignment steps are carried out:

(1) The first gate electrode 102 is patterned;
(2) The thin-film semiconductor 104 is patterned;
(3) The second gate electrode 108, source electrode/interconnects 109, and drain electrode/interconnects 110 are patterned; and
(4) The source region 105 and drain region 106 are patterned.

In other photolithographic steps, no mask alignment is required. Every pattern can be formed by self-aligned technology.

For the bottom-gate TFT of the prior art structure, four mask alignment steps are carried out where back-side exposure technology is utilized. That is, in spite of the provision of the second gate electrode 108, the present embodiment uses the same number of mask alignment steps as the prior art technique. In this way, in the present embodiment, any extra processing step is not added as compared with the prior art technique.

In the present embodiment, the second gate electrode 108 does not have a fine-line geometric pattern as shown in FIG. 7(B) but is electrically equivalent to the second gate electrode shown in FIG. 7(B), for the following reason. The insulator pattern 113 electrically shields the thin-film semiconductor from those portions of the second gate electrode which are present on the insulator pattern. The insulator layer 113 is patterned by a self-aligned technology by the first gate electrode 102. Therefore, the base region and first gate electrode 102 are substantially identical in geometry. If the layer is patterned by a non-self-aligned technique, then mask registration errors (mask alignment errors) will produce some overlap.

The present invention has made it possible to reduce the leakage current when a thin-film semiconductor device is in an unselected state. However, in a selected state, the drain current is comparable to the current obtained heretofore. As a result, the on/off current ratio can be improved. The inventive thin-film semiconductor is especially advantageously used in applications where a high on/off current ratio and dynamic operation are required such as transistors for controlling pixels in the active matrix circuit of a liquid crystal display which are required to produce low leakage current between source and drain regions.

In this manner, the present invention is industrially advantageous.

What is claimed is:

1. A semiconductor device comprising:
   a substrate having an insulating surface;
   a semiconductor film having a source region, a drain region and a first region between said source region and said drain region, provided over said substrate;
   a first gate electrode provided under said semiconductor film with a first gate insulating film interposed therebetween; and
   a plurality of second gate electrodes provided over said semiconductor film with a second gate insulating film interposed therebetween,
   wherein said plurality of second gate electrodes cover a part of said first region through said second gate insulating film.

2. A semiconductor device according to claim 1, wherein the number of said plurality of second gate electrodes is three or more.

3. An active matrix pixel controller for a liquid crystal display comprising an array of semiconductor devices, each semiconductor device of said array of semiconductor devices comprising:
   a substrate having an insulating surface;
   a semiconductor film having a source region, a drain region and a first region between said source region and said drain region provided over said substrate;
   a first gate electrode provided under said semiconductor film with a first gate insulating film interposed therebetween; and
   a plurality of second gate electrodes provided over said semiconductor film with a second gate insulating film interposed therebetween,
   wherein said plurality of second gate electrodes cover a part of said first region through said second gate insulating film.

4. A semiconductor device comprising:
   a semiconductor film having a source region, a drain region and a first region between said source region and said drain region;
   a first gate electrode coupled to a first surface of said first region;
   a first gate insulating film provided between said semiconductor film and said first gate electrode;
   a plurality of second gate electrodes coupled to a second surface of said first region; and
   a second gate insulating film provided between said semiconductor film and said plurality of second gate electrodes,
   wherein said plurality of second gate electrodes and said first region overlap each other at a part of said second surface through said second gate insulating film.

5. A semiconductor device according to claim 4, wherein the number of said plurality of second gate electrodes is three or more.

6. An active matrix pixel controller for a liquid crystal display comprising an array of semiconductor devices, each semiconductor device of said array of semiconductor devices comprising:
   a semiconductor film having a source region, a drain region and a first region between said source region and said drain region;
   a first gate electrode coupled to a first surface of said first region;
   a first gate insulating film provided between said semiconductor film and said first gate electrode;
   a plurality of second gate electrodes coupled to a second surface of said first region; and
   a second gate insulating film provided between said semiconductor film and said plurality of second gate electrodes,
   wherein said plurality of second gate electrodes and said first region overlap each other at a part of said second surface through said second gate insulating film.

7. A semiconductor device comprising:
   a substrate having an insulating surface;
   a semiconductor film having a source region, a drain region and a first region between said source region and said drain region provided over said substrate;
   a first gate electrode provided under said semiconductor film with a first gate insulating film interposed therebetween; and
   a plurality of second gate electrodes provided over said semiconductor film with a second gate insulating film interposed therebetween,
   wherein said first gate electrode and said first region overlap each other at a first part of said first region through said first gate insulating film, and said plurality of second gate electrodes cover a second part of said first region through said second gate insulating film.

8. A semiconductor device according to claim 7, wherein the number of said plurality of second gate electrodes is three or more.

9. An active matrix pixel controller for a liquid crystal display comprising an array of semiconductor devices, each semiconductor device of said array of semiconductor devices comprising:

a substrate having an insulating surface;

a semiconductor film having a source region, a drain region and a first region between said source region and said drain region provided over said substrate;

a first gate electrode provided under said semiconductor film with a first gate insulating film interposed therebetween; and a plurality of second gate electrodes provided over said semiconductor film with a second gate insulating film interposed therebetween, wherein said first gate electrode and said first region overlap each other at a first part of said first region through said first gate insulating film, and said plurality of second gate electrodes cover a second part of said first region through said second gate insulating film.

10. A semiconductor device comprising:

a semiconductor film having a source region, a drain region and a first region between said source region and said drain region;

a first gate electrode coupled to a first surface of said first region;

a first gate insulating film provided between said semiconductor film and said first gate electrode;

a plurality of second gate electrodes coupled to a second surface of said first region; and a second gate insulating film provided between said semiconductor film and said second gate electrode, wherein said first gate electrode and said first surface overlap each other at a part of said first surface through said first gate insulating film, and said plurality of second gate electrodes and said second surface overlap each other at a part of said second surface through said second gate insulating film.

11. A semiconductor device according to claim 10, wherein the number of said plurality of second gate electrodes is three or more.

12. An active matrix pixel controller for a liquid crystal display comprising an array of semiconductor devices, each semiconductor device of said array of semiconductor devices comprising:

a semiconductor film having a source region, a drain region and a first region between said source region and said drain region;

a first gate electrode coupled to a first surface of said first region;

a first gate insulating film provided between said semiconductor film and said first gate electrode;

a plurality of second gate electrodes coupled to a second surface of said first region; and a second gate insulating film provided between said semiconductor film and said second gate electrode, wherein said first gate electrode and said first surface overlap each other at a part of said first surface through said first gate insulating film, and said plurality of second gate electrodes and said second surface overlap each other at a part of said second surface through said second gate insulating film.

13. A semiconductor device comprising:

a substrate having an insulating surface;

a semiconductor film having a source region, a drain region and a first region between said source region and said drain region provided over said substrate;

a first gate electrode provided under said semiconductor film with a first gate insulating film therebetween;

a second gate insulating film provided over said semiconductor film;

a plurality of insulators provided over said second gate insulating film; and a second gate electrode provided over said second gate insulating film and said plurality of insulators, wherein said first gate electrode and said first region overlap each other at a part of said first region through said first gate insulating film, and said plurality of insulators cover said first gate electrode through said first and second gate insulating films and said semiconductor film, said plurality of insulators comprising different material from said second gate insulating film.

14. A semiconductor device according to claim 13, wherein said second gate insulating film is silicon nitride and said plurality of insulators are silicon oxide.

15. An active matrix pixel controller for a liquid crystal display comprising an array of semiconductor devices, each semiconductor device of said array of semiconductor devices comprising:

a substrate having an insulating surface;

a semiconductor film having a source region, a drain region and a first region between said source region and said drain region provided over said substrate;

a first gate electrode provided under said semiconductor film with a first gate insulating film therebetween;

a second gate insulating film provided over said semiconductor film;

a plurality of insulators provided over said second gate insulating film; and a second gate electrode provided over said second gate insulating film and said plurality of insulators, wherein said first gate electrode and said first region overlap each other at a part of said first region through said first gate insulating film, and said plurality of insulators cover said first gate electrode through said first and second gate insulating films and said semiconductor film, said plurality of insulators comprising different material from said second gate insulating film.

16. A semiconductor device comprising:

a semiconductor film having a source region, a drain region and a first region between said source region and said drain region;

a first gate electrode coupled to a first surface of said first region;

a first gate insulating film provided between said semiconductor film and said first gate electrode;

a second gate electrode coupled to a second surface of said first region; and a second gate insulating film and a plurality of insulators provided between said semiconductor film and said second gate electrode, wherein said first gate electrode and said first region overlap each other at a part of said first surface through said first gate insulating film, and said plurality of insulators and said first gate electrode overlap each other through said first and second insulating films and said semiconductor film, said plurality of insulators comprising different material from said second gate insulating film.

17. A semiconductor device according to claim 16, wherein said second gate insulating film is silicon nitride and said plurality of insulators are silicon oxide.

18. An active matrix pixel controller for a liquid crystal display comprising an array of semiconductor devices, each semiconductor device of said array of semiconductor devices comprising:

a semiconductor film having a source region, a drain region and a first region between said source region and said drain region;

a first gate electrode coupled to a first surface of said first region;

a first gate insulating film provided between said semiconductor film and said first gate electrode;

a second gate electrode coupled to a second surface of said first region; and a second gate insulating film and a plurality of insulators provided between said semiconductor film and said second gate electrode, wherein said first gate electrode and said first region overlap each other at a part of said first surface through said first gate insulating film, and said plurality of insulators and said first gate electrode overlap each other through said first and second insulating films and said semiconductor film, said plurality of insulators comprising different material from said second gate insulating film.

* * * * *